United States Patent
Shi

Patent Number: 5,157,014
Date of Patent: Oct. 20, 1992

[54] HIGH TEMPERATURE CRYSTALLINE SUPERCONDUCTORS FROM CRYSTALLIZED GLASSES

[75] Inventor: Donglu Shi, Downers Grove, Ill.

[73] Assignee: Arch Development Corp.

[21] Appl. No.: 276,379

[22] Filed: Nov. 23, 1988

[51] Int. Cl.$^5$ .................. C03C 10/02; C03C 3/12; H01B 1/08
[52] U.S. Cl. .................. 505/1; 501/10; 501/41; 505/733; 505/782
[58] Field of Search .................. 505/1, 733, 782; 501/10, 41

[56] References Cited

PUBLICATIONS

Matsushita et al.; "Superconductor Glass-Ceramic By Melting-Quenching Method", Translation from Nikkan Kogyo Shimban, Mar. 16, 1988, 4 pages.
Komatsu et al.; "High-$T_c$ Superconducting Glass Ceramics Based on the Bi–Ca–Sr–Cu–O System", Japan Journal Applied Physics, vol. 27, No. 4, Apr. 1988, pp. L550–L552.
Minami et al.; "Glass Formation of High $T_c$ Compound BiCaSrCu$_2$O$_x$ by Rapid Quenching" Japan Journal Applied Physics, vol. 27, No. 5, May 1988, pp. L777–L778.
Inoue et al.; "Production of Bi–Sr–Ca–Cu–O Glasses by Liquid Quenching & Their Glass Transition & Structured Relaxation", Japan Journal Applied Physics, vol. 27, No. 6, Jun. 1988, pp. L941–L943.
Garzon et al.; "Amorphous-to-Crystalline Transformations in Bismuth-Oxide-Based High $T_c$ Superconductors"; Appl. Phys. Lett., vol. 53, No. 9, Aug. 29, 1988, pp. 805–807.
Hinks et al.; "Preparation of Bi–Sr–Ca–Cu–O Superconductors from Oxide–Glass Precursors" Appl. Phys. Lett, vol. 53, No. 5, Aug. 1, 1988, pp. 423–425.
Akamatsu et al.; "Instantaneous Preparation of Superconducting Thick Films through Melts in the Bi–Ca–Sr–Cu–O System", Japan Journal Appld. Phys, vol. 27, No. 9, Sep. 1988, pp. L1696–L1698.
Abe et al.; "Superconducting Glass-Ceramic Rods in BiCaSrCu$_2$O$_x$ Prepared by Crystallization Under a Temperature Gradient"; Appl. Phys. Lett, vol. 53, No. 14, Oct. 3, 1988, pp. 1341–1342.
Zheng et al.; "Bi$_4$Sr$_3$Ca$_3$Cu$_4$O$_{16}$ Glass and Superconducting Glass Ceramics"; Physical Review B, vol. 38, No. 10, Oct. 1, 1988, pp. 7166–7168.

*Primary Examiner*—Mark L. Bell

[57] ABSTRACT

A method of preparing a high temperature superconductor from an amorphous phase. The method involves preparing a starting material of a composition of Bi$_2$Sr$_2$Ca$_3$Cu$_4$Ox or Bi$_2$Sr$_2$Ca$_4$Cu$_5$Ox, forming an amorphous phase of the composition and heat treating the amorphous phase for particular time and temperature ranges to achieve a single phase high temperature superconductor.

7 Claims, 8 Drawing Sheets

FIG. 2B(1)
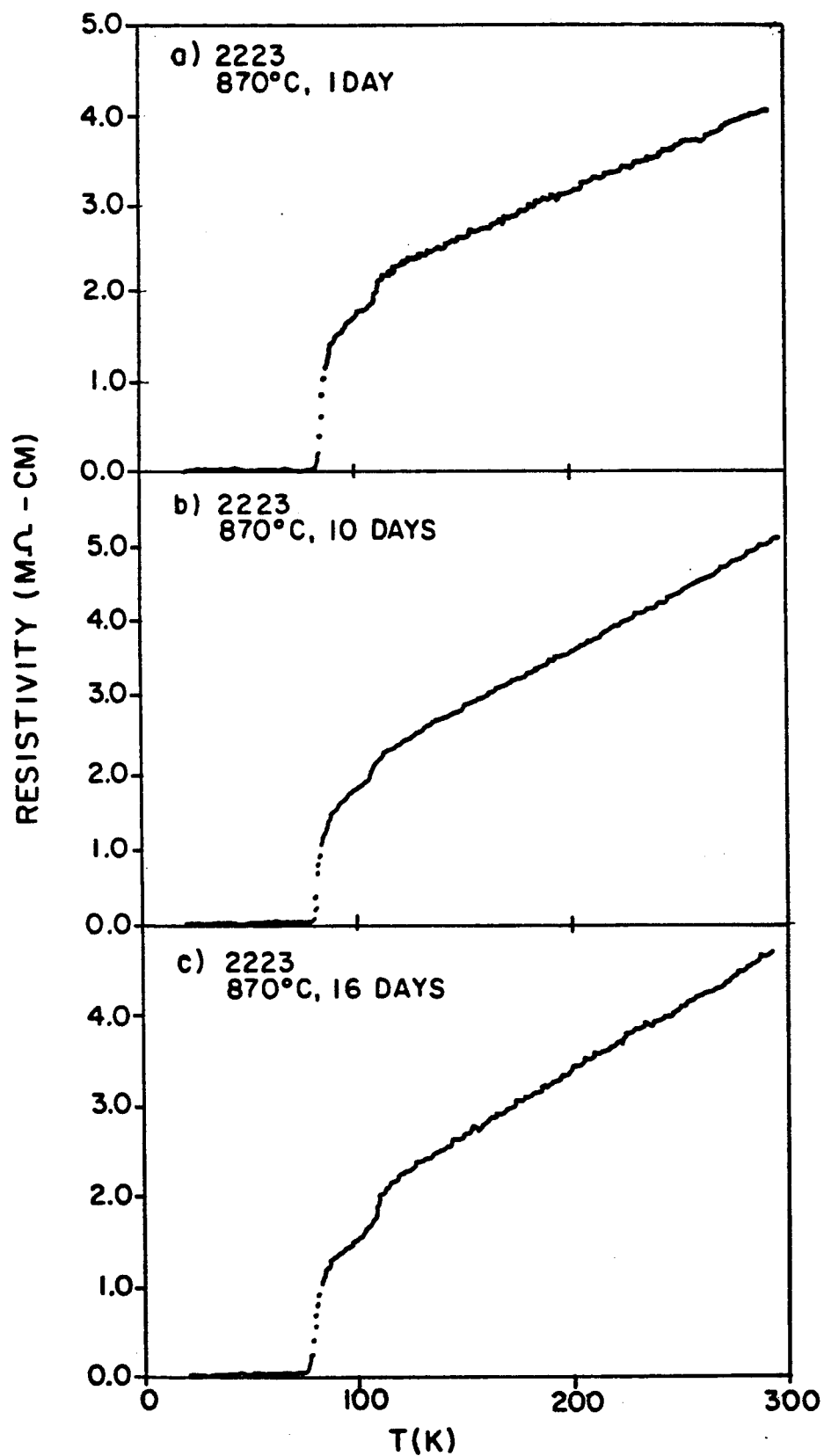

FIG. 2B(2)
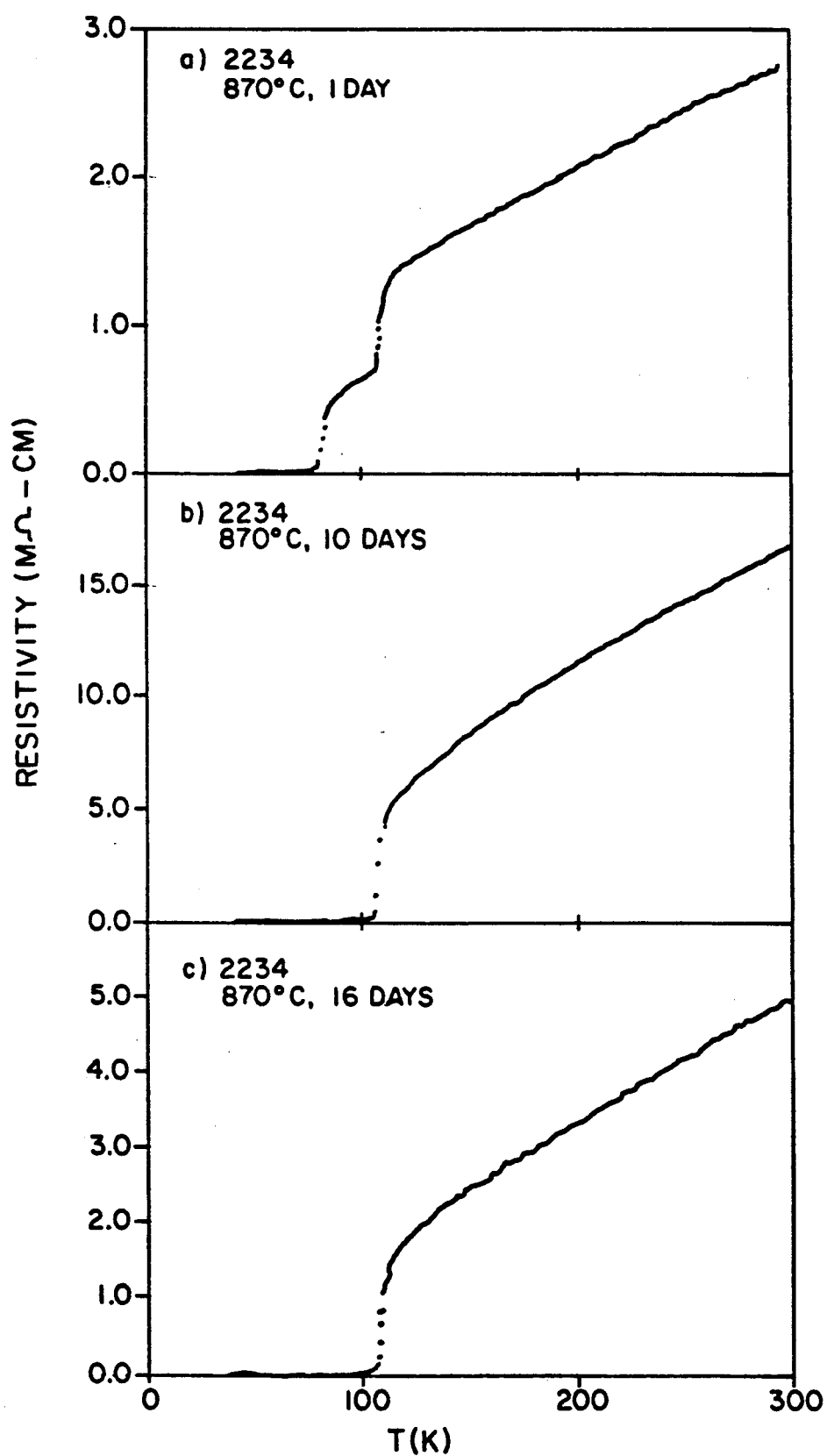

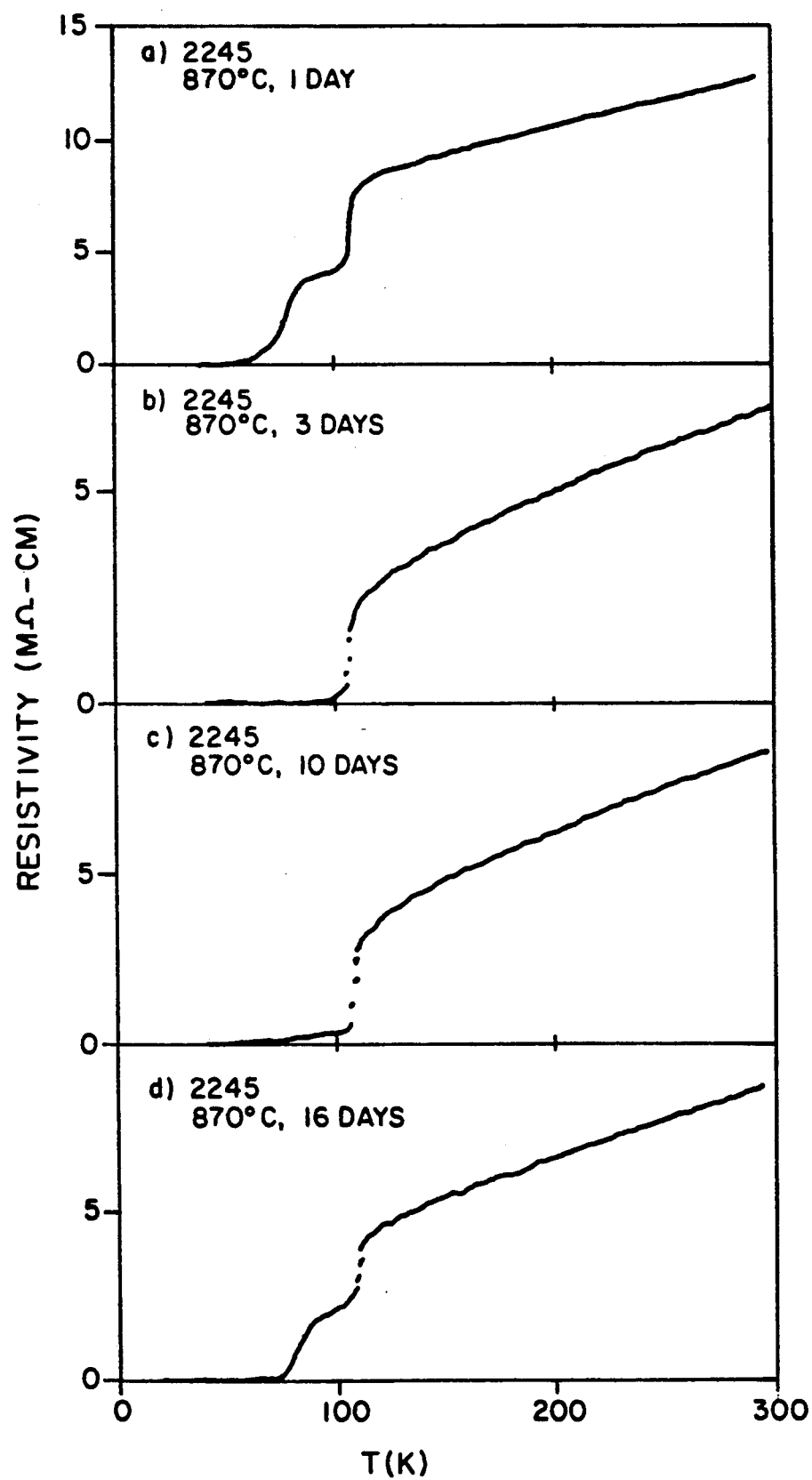

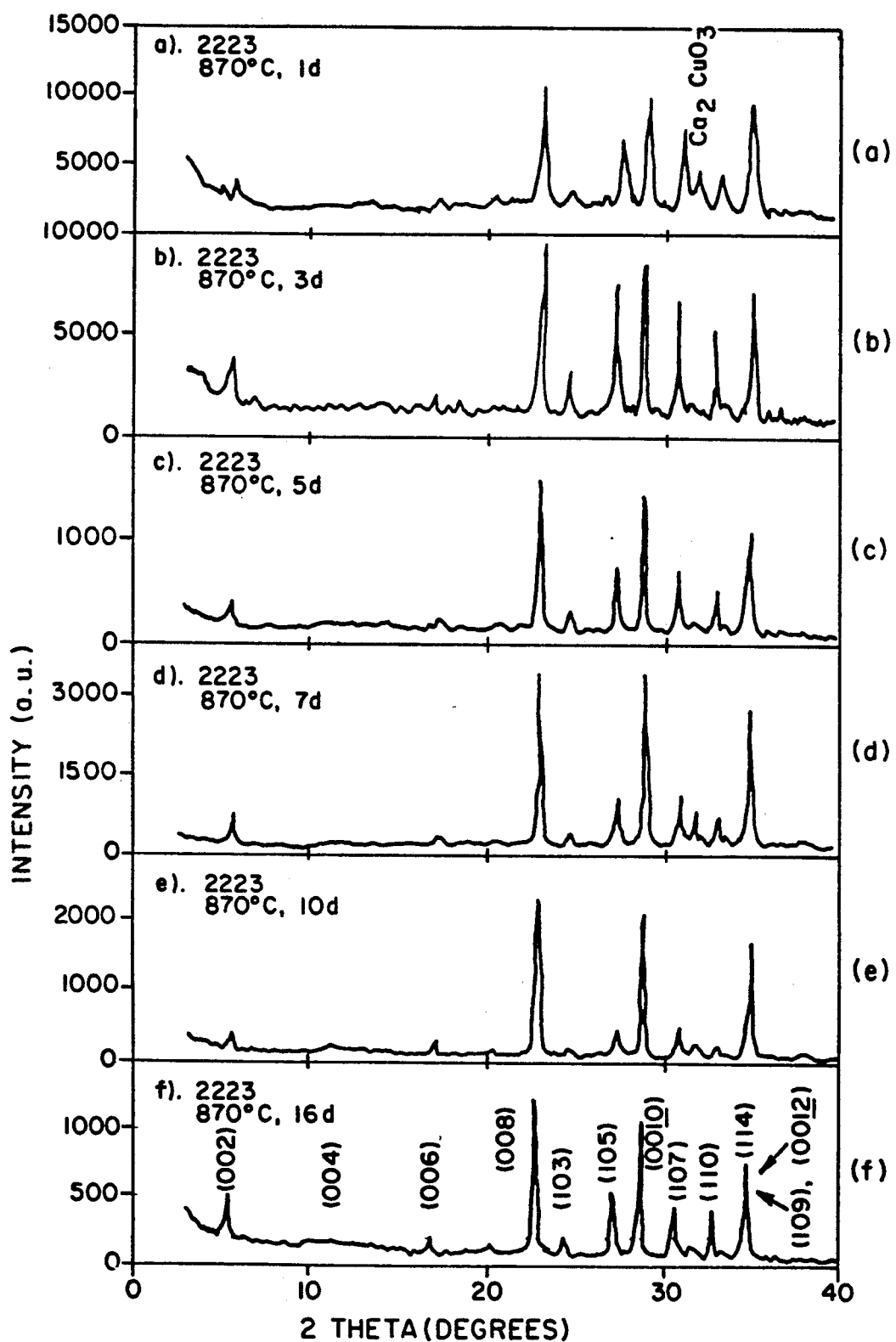

HIGH TEMPERATURE CRYSTALLINE SUPERCONDUCTORS FROM CRYSTALLIZED GLASSES

CONTRACTUAL ORIGIN OF THE INVENTION

The U.S. Government has rights in this invention pursuant to Contract No. W-31-109-ENG-38 between the U.S. Department of Energy and Argonne National Laboratories. The University of Chicago (ARCH Development Corporation) has elected to take title to the invention with a Confirmatory License back to the Department of Energy.

BACKGROUND OF THE INVENTION

The present invention relates generally to a method of producing a high critical temperature ($T_c$) superconducting ceramic material. More particularly, the invention relates to a superconducting ceramic material composed substantially of a single phase prepared by heat treating a starting, glassy ceramic material within a preselected time and temperature transformation region.

High $T_c$ ceramic superconductor materials of the Bi-Sr-Ca-Cu-O system have recently been discovered, and substantial effort has been expended in an attempt to understand the fundamental characteristics of these ceramics. Preparation of the high $T_c$ ceramic materials typically has involved conventional ceramic processing techniques. In particular, work has been directed to the production of the highest $T_c$ phase of Bi-Sr-Ca-Cu-O wherein the $T_c$ is about 110° K., compared to other crystalline phases having $T_c$ values of 20° K. and 85° K. These approaches usually involve heat treatment of sintered polycrystalline materials, but to date there has not been a suitable method devised for reliable Production of significant quantities of the 110° K. phase. Current methods result in sizable quantities (typically more than about 10%) of the lower $T_c$ phases being produced, and these phases cannot be eliminated by conventional heat treatment. Such multi-phase structures have substantial commercial disadvantages compared to a single phase structure having a $T_c$ of 110° K. Such polycrystalline starting materials include various inherent barriers to forming a single phase material, such as grain boundaries and contaminants which are difficult to overcome in order to form the desired single phase structure.

OBJECTS OF THE INVENTION

It is therefore an object of the invention to provide an improved ceramic superconductor material and method of manufacture.

It is another object of the invention to provide a novel ceramic superconductor material and method of manufacture of a single phase crystalline structure having a high $T_c$.

It is a further object of the invention to provide an improved ceramic superconductor material prepared by heat treating an amorphous starting material under preselected time and temperature conditions.

It is an additional object of the invention to provide a novel ceramic superconducting material composed of Bi-Sr-Ca Cu-O having a Ca:Bi ratio in excess of or equal to about 1.0 and less than or equal to about 1.5.

A significant feature in accordance with the invention lies in the production of a high $T_c$ ceramic superconductor having substantially a single crystalline phase. The starting material has a predetermined composition, and an amorphous phase is prepared from the starting material. The amorphous phase undergoes a heat treatment within certain time and temperature transformation regions, which results in transformation from the amorphous phase to a crystalline material comprised substantially of a single phase. The amorphous phase can be prepared by conventional splat quenching methods, such as spin casting.

Further objects and advantages of the present invention, together with the organization and manner of operation thereof will become apparent from the following detailed description of the invention when taken in conjunction with the accompanying drawings.

BRIEF DESCRIPTION OF THE DRAWINGS

FIG. 2B (1-3) shows resistivity measurements for selected annealing time periods on various compositions from the Bi-Sr-Ca-Cu-O system; FIG. 4A-C illustrates x-ray diffraction spectra for three compositions of the Bi-Sr-Ca-Cu-O system undergoing cyclic phase changes.

DETAILED DESCRIPTION OF PREFERRED EMBODIMENTS

Figure 1:
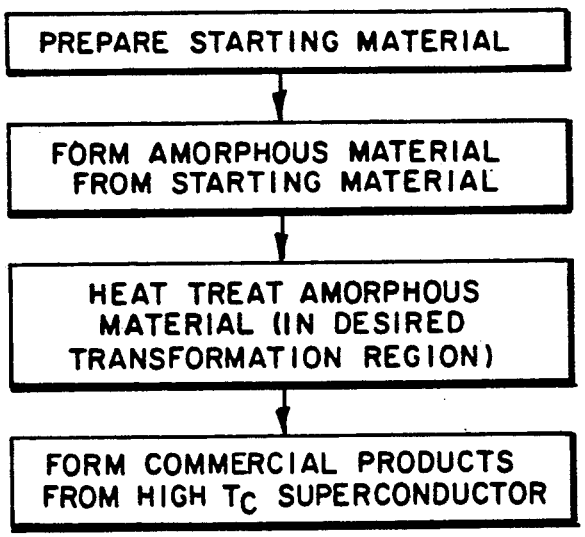
FIG. 1 illustrates a method of preparation of high $T_c$ superconducting material.

Referring now to FIG. 1, an improved high $T_c$ ceramic superconducting material can be prepared in accordance with the invention in the illustrated manner. The starting, raw material can be a chemical or mechanical mixture of the selected composition for any one of the new ceramic superconductors. For example, several types of compounds are the Bi-Sr-Ca-Cu-O system or the Y-Ba-Cu-O system. The preferred chemical composition range for the first system is $Bi_xSr_bCa_zCu_yO_z$ with a ratio of a:x greater than or equal to 1.0 and less than or equal to 1.5, such as, $Bi_2Sr_2Ca_2Cu_4O_z$, $Bi_2Sr_2Ca_3Cu_4O_z$ and $Bi_2Sr_2Ca_4Cu_5O_z$. It has been found that in the preferred embodiment that one can readily obtain $Bi_2Sr_2Ca_2Cu_3O_z$ by starting with excess Ca (a:x $\geq$ 1) to compensate for loss of some Ca during processing. Typical raw materials are therefore appropriate quantities of $Bi_2O_3$, $SrCO_3$, $CaCO_3$ and $CuO$. These materials are converted to powders by thoroughly mixing in a wet ball mill in a conventional manner. The premixed powders are calcined in air at about 800° C. for 12 hours, and this prereacted material is melted in a platinum crucible. The molten mixture in the crucible is splat quenched onto a heat sink (such as a copper block) to form an amorphous, or glassy phase. Conventional methods of performing such splat quenching operations include spin casting.

Once the amorphous phase (or phases) has been formed, the amorphous material is subjected to a heat treatment for a preselected temperature and time, causing transformation from the amorphous state to the crystalline state. Various preferred compositions have undergone numerous temperature/time treatments in order to determine suitable transformation regions which will produce a substantially single phase crystalline material of the high $T_c$ superconductor.

Important advantages arise from genera high $T_c$ crystalline phase from an amorphous starting material. When prepared properly the amorphous starting material itself has little or no porosity. The resulting material crystallized from the amorphous material also exhibits a very low porosity and has a density approaching one hundred percent. In addition, nucleation and growth of crystalline grains from the amorphous state results in a much more stable structure, such as low energy grain boundaries. This is unlike sintered crystalline materials which exhibit high energy, mismatched grain boundaries and also such materials tend to have substantial intergranular porosity. The porosity and the high energy grain boundaries tend to diminish the electrical transport properties in such polycrystalline, sintered materials. The amorphous starting material used in the invention is also highly uniform compared to a starting mechanical mixture of polycrystalline metallic oxides to be combined to form the high $T_c$ ceramic materials. Consequently, if one begins with an amorphous starting material, the kinetics are much more favorable for the formation of a uniform high $T_c$ ceramic microstructure compared to beginning with mixtures of polycrystalline metal oxides (such as, $Bi_2O_3$, $SrCo_3$, $CaCo_3$ and $CuO$).

Figure 2A:
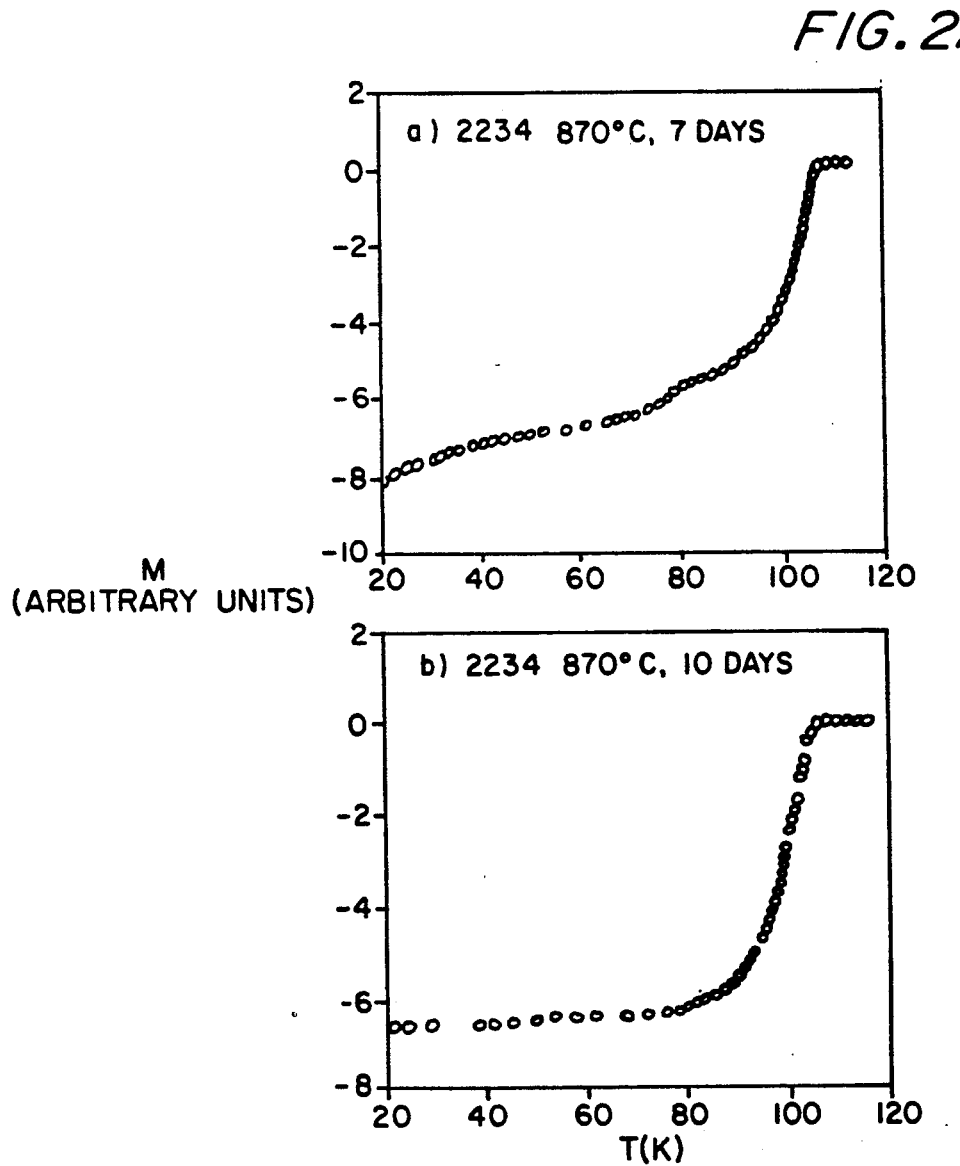
FIG. 2A shows Magnetization Shielding Effect measurements on superconducting composition of the Bi-Sr-Ca-Cu-O system.

In the case of the Bi-Sr-Ca-Cu-O system, the desired ceramic crystalline phase exhibits a $T_c$ of about 110° K. as determined by resistivity measurements and conventional Magnetization Shielding Effect measurements (See, FIG. 2). As can be noted from the data in FIG. 2A and B, there can be more than one crystalline phase produced from the amorphous material, depending on the composition, the time and the temperature of the heat treatment schedule. In FIG. 2A both the $Bi_2Sr_2Ca_2Cu_3O_x$ and $Bi_2Sr_2Ca_4Cu_5O_z$, show evidence of at least two crystalline phases, having characteristic $T_c$ values of 110° and 85° K. For the illustrated heat treatment conditions only the $Bi_2Sr_2Ca_3Cu_4O_z$ has a single $T_c$ value of 110° K. Due to the possibility of conduction occurring along a percolation path thru the material, conventional resistivity measurements (see, FIG. 2) cannot provide conclusive evidence that a material is only composed of one $T_c$ phase. Thus, in order to be certain the material is substantially a single phase, one should perform another measurement, such as, a conventional Magnetization Shielding Effect measurement which does account for the relative volumes of the different magnetic phases present in the superconducting material. As seen in FIG. 2 A, (upper plot) the $Bi_2Sr_2Ca_3Cu_4O_z$, which has been heat treated for only seven days, does indeed exhibit the presence of a second phase having a $T_c$ of 85° K. After further heat treatment for a total of ten days, the Magnetization Shielding Effect signal arising from the 85° K. phase has virtually vanished, leaving substantially a single phase high $T_c$ (110° K.) material (See FIG. 2A, lower plot).

Figure 3:
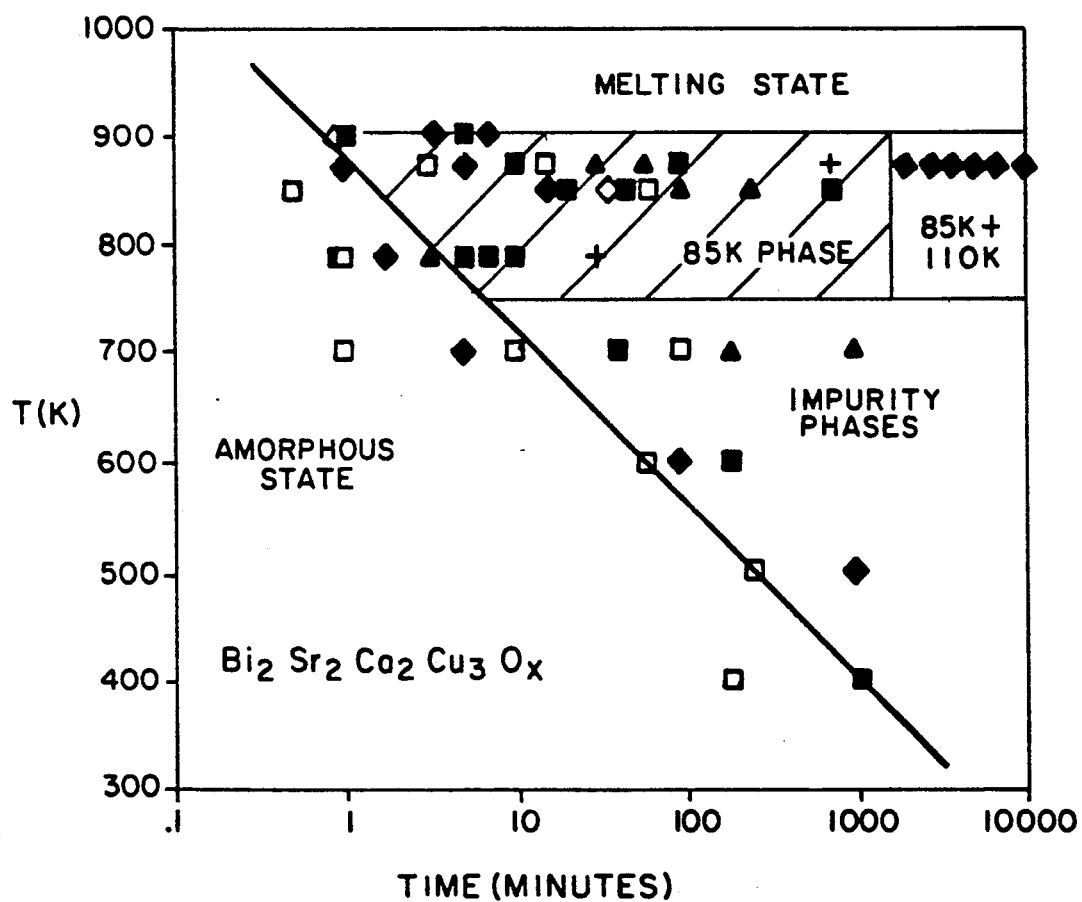
FIG. 3 illustrates a time and temperature transformations diagram for one of the compositions of the superconducting ceramic system.

For each of the preferred compositions of the Bi-Sr-Ca-Cu-O system, a matrix of heat treatment schedules were performed. Details of these results are set forth in the Examples described hereinafter. The treated specimens were each characterized by the Magnetization Shielding Effect measurements as well as resistivity measurements, and a time-temperature transformation diagram can be determined as shown in FIG. 3. The various regions resulting from this determination include amorphous regions, crystalline regions and mixtures of these two general phases. Similar such transformation diagrams can also be prepared for other systems, such as the Y-Ca-Cu-O system, in order to define other suitable transformation regions for forming high $T_c$ crystalline material from amorphous starting material.

In other forms of the invention, once the high $T_c$ ceramic, single-phase crystalline material has been formed, various commercial products can be produced as depicted generally in FIG. 1.

In another form of the invention a phase change cycle is observed during the crystallization annealing process. This cyclic phase change phenomenon has been followed by electron microscopy and also by x-ray diffraction results shown in FIGS. 4A, 4B and 4C for the samples having nominal composition 2223, 2234, and 2245, respectively. The angle 2 theta and d-spacing values are indicated in Table I and II for the 85K and 110K phases, respectively.

The x-ray diffraction data for the "2223" samples annealed at 870° C. for 1 day, 3 days, 5 days, 7 days, 10 days, and 16 days are shown in FIG. 4 (a-f) respectively. As seen in FIG. 4A, the annealing process does not have a strong effect in terms of phase changes. The crystallized product is mostly 85K phase, although certain texturing is observed. As can be seen from FIG. 4A (b-e) the (001) peaks are intensifying while the non-(001) peaks are disappearing. Electron microscopy results have indicated that the observed texturing is due to rapidly growing plate-like grains with diameter of 20 micrometers and thickness of 0.5 micrometers at 10 days anneal. These plate-like grains are then replaced by rod-like grains as the anneal is prolonged from 10 days to 16 days. As noted in FIG. 4A(f), the non-(001)) peaks are growing back again in a cyclic manner.

Figure 4B:
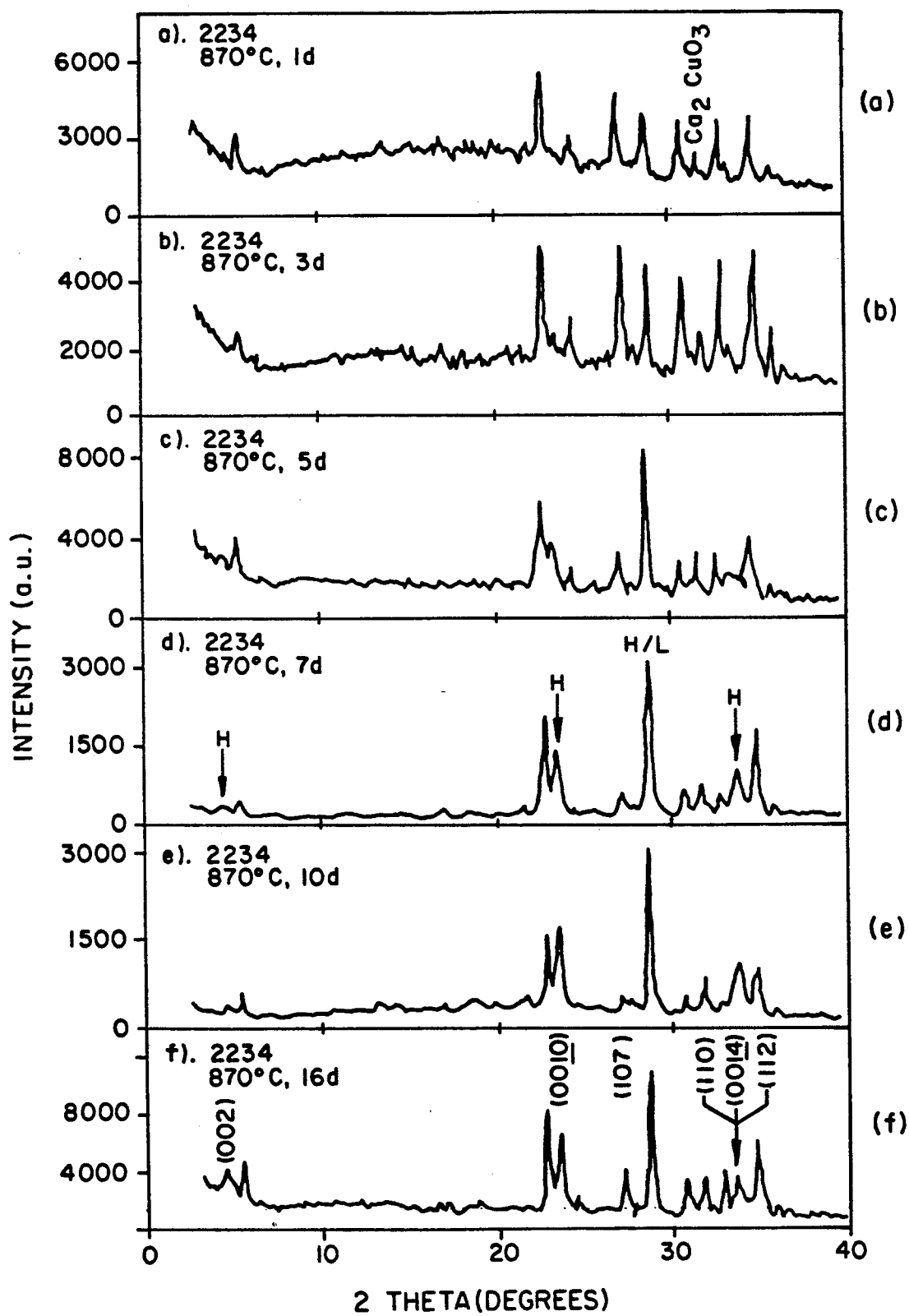

A larger amount of the 110K superconducting phase is formed in crystallized samples as the Ca and Cu contents of the samples are increased to 3 and 4, respectively. The x-ray plots for the 2234 samples are presented in FIG. 4B. As can be seen in the figure, the volume percent of the 110K phase is increasing with annealing time at 870° C. The most noticeable peak of the 110K phase is the (0010) diffraction peak, shown in FIGS. 4B(b-e). However, as the anneal is prolonged from 10 days to 16 days at 870° C., the amount of 110K phase is dropping as indicated in FIG. 4B(f). The texturing effect is also observed in the anneal of the 2234 samples. As seen from FIG. 4B(b-e), the intensities of all non-(001) peaks are decreasing. These peaks are growing back, accompanied with a decrease in the amount of 110K phase as the anneal time is extended from 10 days to 16 days. In this case, there appears to be a phase change cycling period of about 7 days.

Figure 4C:
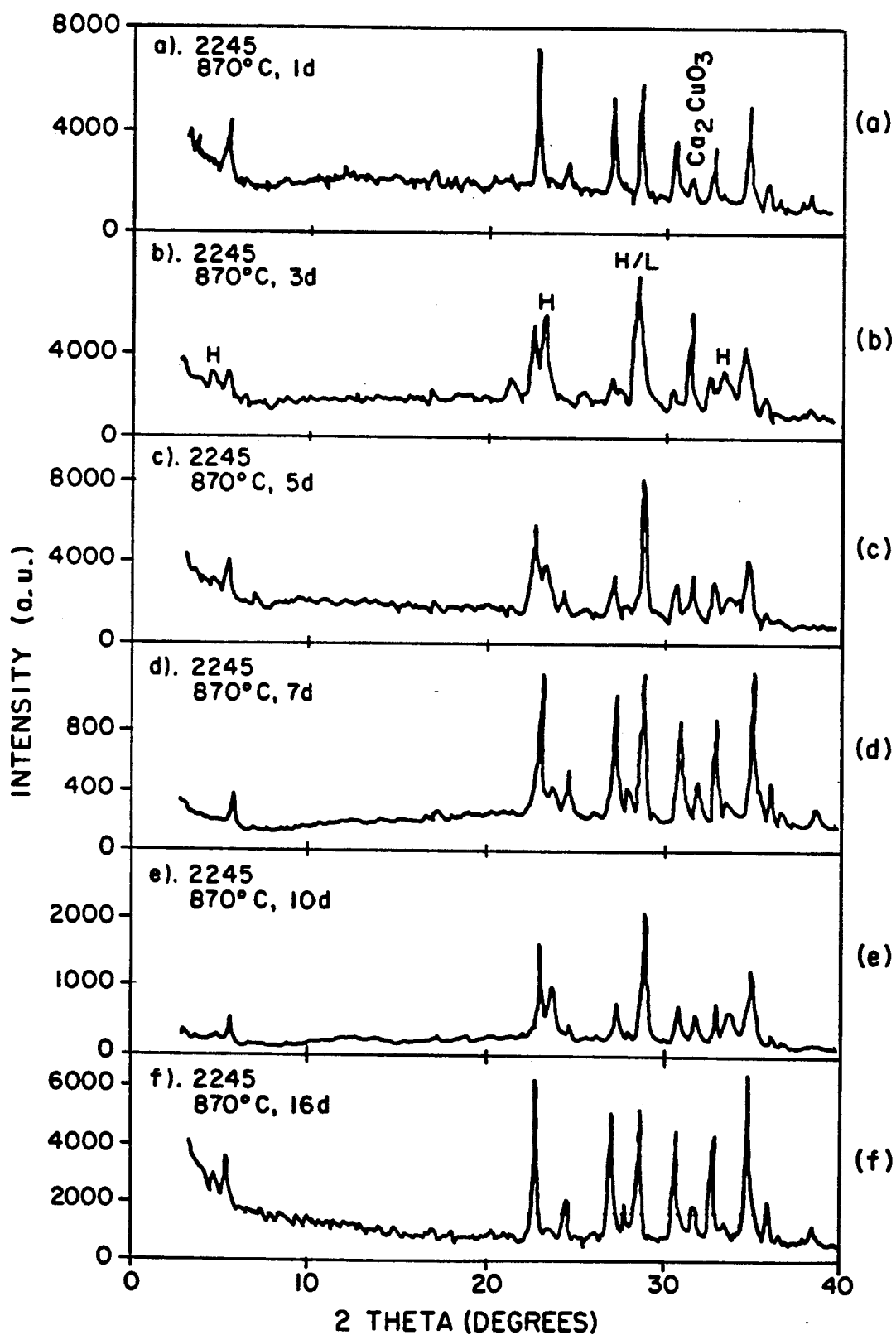

The cyling period is shortened to about 3 days as Ca and Cu are further increased to 4 and 5 in the 2245 nominal composition. As shown in FIG. 4C(a and b), a large portion of the 110K phase has already formed in the sample annealed for 3 days at 870° C. The 110K phase is then gradually vanishing as the anneal time increases from 3 to 7 days, as shown in FIG. 4A(c and d), and it should be noted that the disappearance of the 110K phase is accompanied with the development of the non-(001) peaks, and the texturing effect is found to be increasing as the amount of the 110 K phase increases. After 7 days anneal, the 110 K phase percentage increased again with the increasing texturing effect, as shown in FIG. 4C(e). The cycle is repeated at 16 days—the 110 K phase has disappeared and non-(001) peaks are large. When the 16 day-annealed sample is annealed for another 3 days at 870° C. the 110K phase has again grown back.

TABLE I

X-ray Date for $T_c$ = 85K Phase
($a = b = 3.812$Å, $c = 30.660$Å)

| hkl | 2θ | d (Å) |
|---|---|---|
| 002 | 5.76 | 15.330 |
| 004 | 11.54 | 7.665 |
| 006 | 17.35 | 5.110 |
| 008 | 23.21 | 3.833 |
| 101 | 23.52 | 3.783 |
| 103 | 24.93 | 3.572 |
| 105 | 27.55 | 3.237 |
| 0010 | 29.12 | 3.066 |
| 107 | 31.10 | 2.876 |
| 110 | 33.24 | 2.696 |
| 112 | 33.76 | 2.655 |
| 0012 | 35.12 | 2.555 |
| 114 | 35.30 | 2.543 |
| 109 | 35.33 | 2.540 |
| 116 | 37.73 | 2.384 |

TABLE II

X-ray Date for $T_c$ = 110K Phase
($a = b = 3.812$Å, $c = 38.0$Å)

| hkl | 2θ | d (Å) |
|---|---|---|
| 002 | 4.65 | 19.00 |
| 004 | 9.31 | 9.50 |
| 006 | 13.98 | 6.33 |
| 008 | 18.68 | 4.75 |
| 0010 | 23.41 | 3.80 |
| 101 | 23.45 | 3.79 |
| 103 | 24.38 | 3.65 |
| 105 | 26.15 | 3.41 |
| 0012 | 28.18 | 3.17 |
| 107 | 28.61 | 3.12 |
| 109 | 31.62 | 2.83 |
| 0014 | 33.00 | 2.71 |
| 110 | 33.24 | 2.70 |
| 112 | 33.58 | 2.67 |
| 114 | 34.59 | 2.59 |
| 1011 | 35.05 | 2.56 |
| 116 | 36.22 | 2.48 |
| 0016 | 37.88 | 2.38 |
| 118 | 38.40 | 2.34 |
| 1013 | 38.82 | 2.31 |

The following Examples illustrate the preparation, processing and measurements on various high $T_c$ ceramic superconductors and are not meant to limit the scope of the invention which is set forth in the claims following.

EXAMPLES

Starting materials of $Bi_2O_3$, $SrCO_3$, $CaCO_3$, and CuO are weighed with nominal compositions of $Bi_2Sr_2Ca_2Cu_3O_z$ (2223), $Bi_2Sr_2Ca_3Cu_4O_x$ (2234) and $Bi_2Sr_2Ca_4Cu_5O_x$ (2245) and thoroughly mixed by a wet ball mill in an agate container. The wet ball milling process used for the Bi-Sr-Ca-Cu-O system requires about forty weight percent of methanol. The milling time is about two hours. After ball milling, the mixed powders are dried in air and put into a platinum crucible and pre-reacted in a box furnace in air at 800° C. for twelve hours. The heating rate is 26° C./min and cooling rate is 7° C./min. The pre-reacted materials are crushed into fairly loose powders and melted in a platinum crucible by a torch using natural gas mixed with oxygen. Two identical copper plates with polished surfaces are pre-heated to about 200° C. prior to quenching. As the material is completely melted in the platinum crucible, it is quickly poured onto the surface of one of the copper plates. In approximately less than one second, the other copper plate is placed on the molten material to carry out a splat quenching operation. The copper plates have the dimension of 120 mm × 80 mm × 40 mm. Extremely dense (virtually 100%) glass plates of rapidly quenched materials are thus formed for the subsequent crystallization heat treatment. The glass samples with nominal compositions of 2223, 2234, and 2245 are annealed at 870° C. in air for 1 day, 3 days, 5 days, 7 days, 10 days, and 16 days. The heating rate for the annealing is 26° C./min and the cooling rate is 70° C./min. The annealing experiment is carried out in a Lindberg box furnace. The techniques used for characterizing the annealed samples are x-ray diffraction, scanning electron microscopy, magnetization shielding measurements and resistivity vs. temperature measurements.

| | |
|---|---|
| annealing temperature = | 870° C. |
| environment = | air |
| heating rate = | 26° C./min |
| cooling rate = | 7° C./min |
| Furnace type = | Lindberg box furnace |
| resistivity vs. temperature = | four probe technique |
| magnetization vs. temperature = | shielding effect, 2 Oe |

| Annealing time (day) | $T_c$ (K) [Magnetization Shielding] | $T_c$ (K) [resistivity] |
|---|---|---|
| NOMINAL COMPOSITION = 2234 | | |
| 1 | 85K | 85K + 110K |
| 3 | 85K + 110K | 85K + 110K |
| 5 | 85K + 110K | 85K + 110K |
| 7 | 110K | 110K |
| 10 | 110K | 110K |
| 16 | 85K + 110K | 110K |
| NOMINAL COMPOSITION = 2245 | | |
| 1 | 85K | 85K + 110K |
| 3 | 85K + 110K | 85K + 110K |
| 5 | 85K + 110K | 85K + 110K |
| 7 | 85K + 110K | 85K + 110K |
| 10 | 110K | 110K |
| 16 | 85K + 110K | 85K + 110K |
| NOMINAL COMPOSITION = 2223 | | |
| 1 | 85K | 85K + 110K |
| 3 | 85K | 85K + 110K |
| 5 | 85K | 85K + 110K |
| 7 | 85K | 85K + 110K |
| 10 | 85K | 85K + 110K |
| 16 | 85K | 85K + 110K |

NOTE: The optimized heat treatment conditions can be found in the annealing temperature and time regions where a single superconducting transition at 110K is obtained as measured by the magnetization shielding experiments.

What is claimed is:

1. A method of preparing a superconductor comprising a crystalline phase with a high critical temperature, comprising the steps of:
    preparing a starting material of a chemical or mechanical mixture having a composition selected from the group consisting of $Bi_2Sr_2Ca_3Cu_4O_x$; $Bi_2Sr_2Ca_4Cu_5O_x$ and mixtures thereof;
    forming an amorphous solid phase by melting said starting material to form a molten mixture and rapidly quenching said molten mixture; and
    heat treating said amorphous solid phase at a temperature of about 870° C. for about 7-10 days and stopping said annealing, causing transformation from said amorphous phase to said crystalline phase composed substantially of a single phase superconductor exhibiting a $T_c$ of about 110° K. as determined by the measurement of substantially zero resistivity for said superconductor.

2. The method as defined in claim 1 wherein said starting material includes excess Ca relative to Bi.

3. The method as defined in claim 1 wherein said amorphous solid phase is prepared by splat quenching said molten mixture of said starting material.

4. The method as defined in claim 1 wherein said amorphous solid phase is prepared by spin casting said molten mixture of said starting material.

5. A method of preparing a superconductor comprising substantially a single phase of a crystalline material having a high critical temperature, comprising the steps of:
preparing a starting material of a chemical or mechanical mixture having a composition to produce a compound of $Bi_2Sr_2Ca_{4-x}Cu_{5-y}O_z$ wherein $0 \leq x = 1$, $0 \leq y \leq 1$ and z is adequate to complete conventional oxidation;
forming an amorphous solid phase by melting said starting material to form a molten mixture and rapidly quenching said molten mixture; and
heat treating said amorphous solid phase at temperatures and times selected from the group consisting of temperature of about 870° C. with time at least about 7-10 days and temperatures more than about 870° C. with times less than about 7-10 days, each of said times and temperatures chosen in the time-temperature-transformation diagrams causing transformation from said amorphous phase to said substantially single phase of crystalline material exhibiting a $T_c$ of about 110° K. as determined by the measurement of substantially zero resistivity for said superconductor.

6. A high critical temperature superconductor made by the method of claim comprising a substantially single phase structure of $Bi_2Sr_2Ca_{4-x}Cu_{5-y}O_z$ wherein $0 \leq x \leq 1$, $0 \leq y \leq 1$, and z the appropriate conventional value to complete adequate conventional oxidation, said single phase structure exhibiting substantially one critical temperature as determined by Magnetization Shielding Effect measurements on said superconductor and said critical temperature being about 110° K. as determined by the measurement of substantially zero resistivity.

7. A method of treating a high critical temperature superconductor having various different critical temperatures, comprising the steps of:
preparing a starting crystalline superconductor having a critical temperature of about 110° K. and selected from the group consisting essentially of $Bi_2Sr_2Ca_{4-x}Cu_{5-y}O_z$ wherein $0 \leq x \leq 1$, $0 \leq y$, 1 and z is the appropriate range of conventional value to complete oxidation depending on x and y by the method of claim 14;
annealing said starting crystalline superconductor at a temperature of about 870° C. and for a time period sufficient to cause at least partial transformation to a second phase having a second critical temperature of about 85° K.; and
annealing at about 870° C. and for said sufficient time period said second superconductor phase having said second critical temperature and transforming said second superconductor phase to reestablish said first superconductor phase having said first critical temperature superconductor phase.

* * * * *